US007820986B2

(12) United States Patent
Lubicki et al.

(10) Patent No.: US 7,820,986 B2
(45) Date of Patent: Oct. 26, 2010

(54) TECHNIQUES FOR CONTROLLING A CHARGED PARTICLE BEAM

(75) Inventors: Piotr R. Lubicki, Peabody, MA (US); Russell J. Low, Rowley, MA (US); Joseph C. Olson, Beverly, MA (US); Anthony Renau, West Newbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 309 days.

(21) Appl. No.: 11/854,852

(22) Filed: Sep. 13, 2007

(65) Prior Publication Data

US 2009/0072163 A1 Mar. 19, 2009

(51) Int. Cl.
*H01J 37/317* (2006.01)
*H05H 5/06* (2006.01)

(52) U.S. Cl. .............. 250/492.21; 315/5.41; 315/5.39; 315/500; 315/506

(58) Field of Classification Search ............ 315/5.41, 315/5.39, 500, 506
See application file for complete search history.

(56) References Cited

U.S. PATENT DOCUMENTS 3,238,489 A * 3/1966 Hay ........................ 338/250
4,383,180 A 5/1983 Turner
6,653,642 B2 11/2003 Pedersen et al.
6,717,079 B2 4/2004 Heller

FOREIGN PATENT DOCUMENTS

JP H08-273896 A 10/1996

OTHER PUBLICATIONS http://www.1728.com/project3.htm, Basic Electricity Tutorial—Relays, Published 2000 by 1728 Software Systems, pp. 1-9.*
U.S. Appl. No. 11/845,441, Tekletsadik et al.
U.S. Appl. No. 11/847,139, Low et al.
U.S. Appl. No. 11/841,086, Tekletsadik et al.
U.S. Appl. No. 11/527,842, Tekletsadik et al.
U.S. Appl. No. 11/872,576, Low et al.
U.S. Appl. No. 11/968,527, Tekletsadik et al.

* cited by examiner

*Primary Examiner*—Jack I Berman

(57) ABSTRACT

Techniques for controlling a charged particle beam are disclosed. In one particular exemplary embodiment, the techniques may be realized as a charged particle acceleration/deceleration system. The charged particle acceleration/deceleration system may comprise an acceleration column. The acceleration column may comprise a plurality of electrodes having apertures through which a charged particle beam may pass. The charged particle acceleration/deceleration system may also comprise a plurality of resistors electrically coupled to the plurality of electrodes. The charged particle acceleration/deceleration system may further comprise a plurality of switches electrically coupled to the plurality of electrodes and the plurality of resistors, each of the plurality of switches may be configured to be selectively switched respectively in a plurality of operation modes.

19 Claims, 4 Drawing Sheets

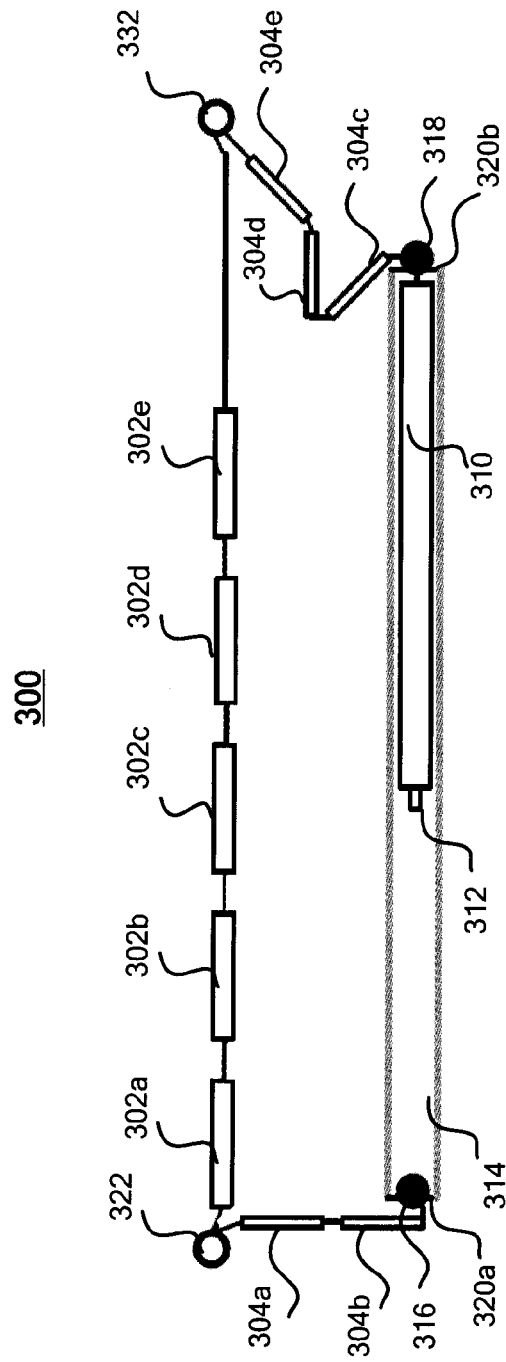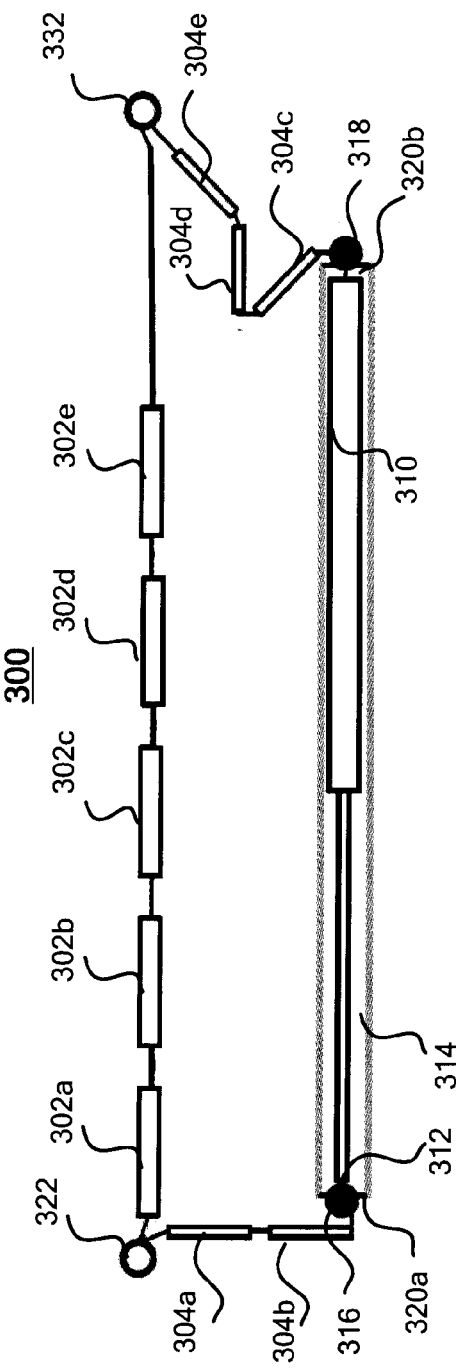
Fig. 3A
Fig. 3B

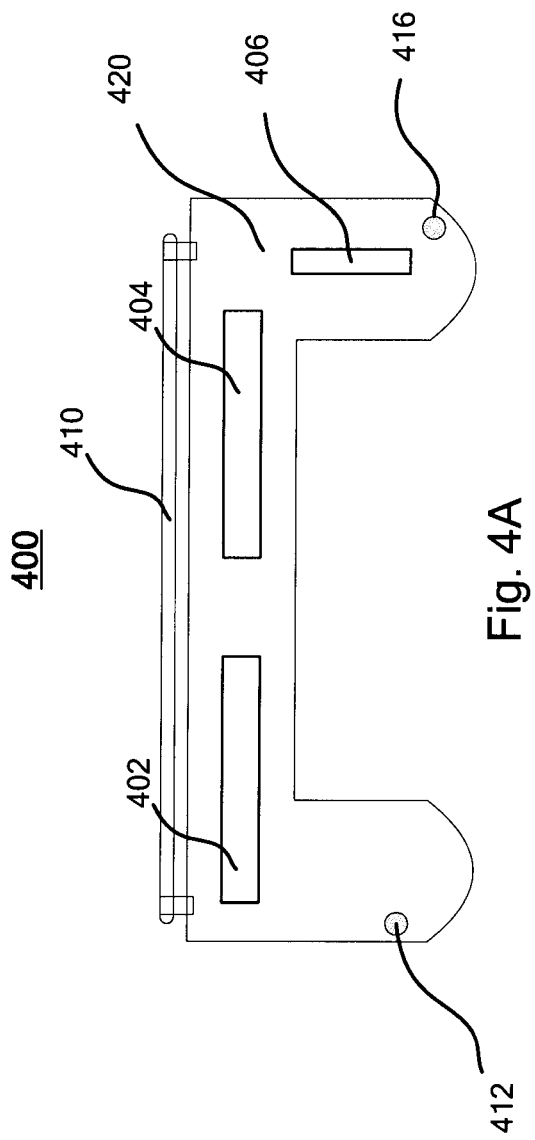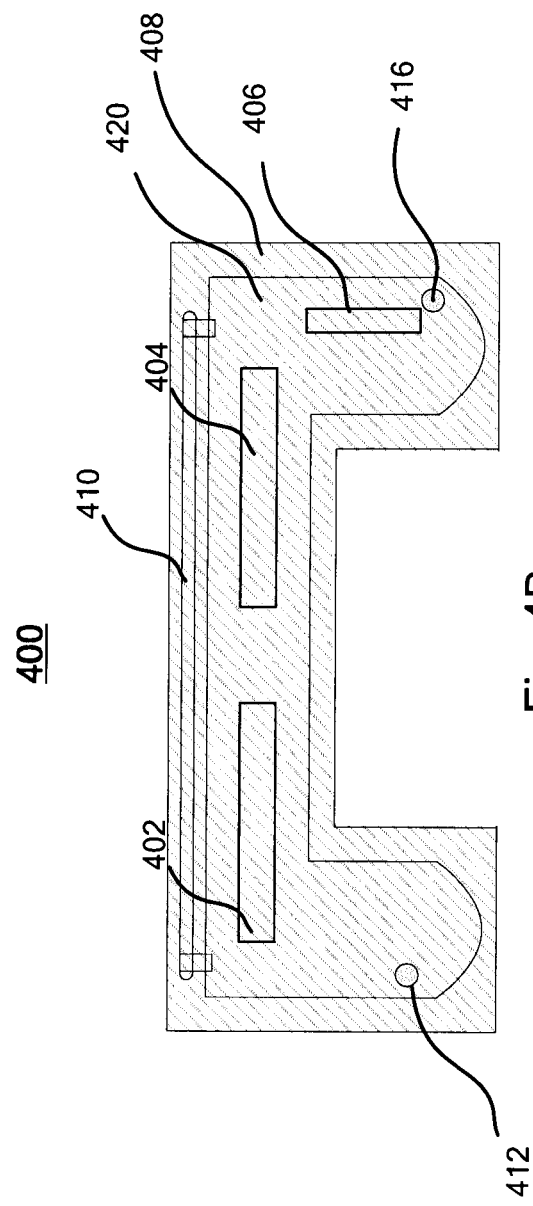

TECHNIQUES FOR CONTROLLING A CHARGED PARTICLE BEAM

FIELD OF THE DISCLOSURE

The present disclosure relates generally to semiconductor manufacturing and, more particularly, to techniques for controlling a charged particle beam.

BACKGROUND OF THE DISCLOSURE

Ion implantation is a process of depositing chemical species into a substrate by direct bombardment of the substrate with energized ions. In semiconductor manufacturing, ion implanters are used primarily for doping processes that alter the type and level of conductivity of target materials. A precise doping profile in an integrated circuit (IC) substrate and its thin-film structure is often crucial for proper IC performance. To achieve a desired doping profile, one or more ion species may be implanted in different doses and at different energy levels.

To form devices on a semiconductor wafer, it is usually necessary to implant impurities at different depths of the semiconductor wafer. The energy of impurities in an ion beam directed toward the semiconductor wafer is determinative of the depth to which the impurities penetrate into the semiconductor wafer. As devices are reduced in size and increased in speed, it has become desirable to use very low energy ion beams to form, for example, shallow transistor junctions in the semiconductor wafer.

At the same time, high energy ion implantation may help minimize production costs because high energy ion implantation does not require some conventional processes, such as, but not limited to, the masking of a semiconductor wafer, to be performed. Also, semiconductor devices manufactured through the use of high energy ion implantation may exhibit relatively low levels of junction leakage and improved latch-up characteristics. Thus, the production yield may be high with respect to an ion implantation process carried out by high energy ion implantation. Therefore, high energy ion implantation may be widely used for implanting ions in semiconductor device manufacturing processes.

FIG. 1 depicts a prior art ion implanter system 100. The ion implanter system 100 may comprise an ion source 102 and a complex series of components through which an ion beam 10 passes. The series of components may include, for example, an extraction manipulator 104, a filter magnet 106, an acceleration or deceleration column 108, an analyzer magnet 110, a rotating mass slit 112, a scanner 114, and a corrector magnet 116. The ion source 102, the extraction manipulator 104, and the filter magnet 106 may be housed in a terminal 118. Much like a series of optical lenses that manipulate a light beam, the ion implanter components can filter and focus the ion beam 10 before steering it towards an end station 120. The ion implanter components that can filter and focus the ion beam 10 may be referred to as optical elements, or beam optics.

The acceleration or deceleration column 108 is a critical component to the ion implanter system 100. As the range of required energy level for ion beam may be wide (e.g., from about 1 kV to above 600 kV), the acceleration or deceleration column 108 may be required to accelerate or decelerate ions to a wide voltage spectrum (e.g., from about 1 kV to above 600 kV).

Conventionally, a resistive divider may be used to gradually accelerate (divide the acceleration potential) or decelerate (divide the deceleration potential) the ion beam along the column 108. That is, one or more resistors may be electrically connected between adjacent electrodes along the column 108. A plurality of resistors may thus form a chain of resistors. Each electrode of the column 108 may be electrically connected to certain electrical contacts along the resistor chain. Thus, the acceleration voltage or deceleration voltage may be distributed by the resistors. The distribution of voltage along the column 108 may be referred to as grading. As the operational voltage spectrum gets wider and upper voltage gets higher, there may be at least two concerns with the conventional resistive divider.

The first concern with the conventional resistive divider in wide range voltage ion implantation may be ballast current. Electrical current flowing through a conventional resistive divider may be referred to as divider current. The divider current sometimes may be referred to as ballast current as it may facilitate the maintenance of a voltage gap between electrodes of the column 108.

For high energy acceleration, beam rigidity may be high. That is, amount of magnetic force or electrostatic force required to deflect a beam may be high. In the mode of high energy acceleration, most ions of an ion beam will not stray away from the direction the ion beam is going and will pass through an aperture of the electrodes of the column 108. Because the ions are charged particles, the transportation of the ions may have an ion beam current. So, for high energy acceleration, there is little interception of ions by the electrodes of the column 108. The ion beam current may have very little loss. The electrodes are not going to charge up since the ion beam is well focused and stable operation can be achieved. Thus, divider current flowing through the chain of dividing resistors may be relatively low (e.g., hundreds of micro amperes), but may still maintain the voltage gap between electrodes of the column 108. Therefore, a relatively low ballast current may be required for high energy acceleration.

When the acceleration voltage goes down (e.g., low to medium energy acceleration or deceleration), the divider current may be in low micro-amperes (i.e., V/R is lower). In this case, low current may perform grading. However, beam rigidity may also be lower compared with high energy acceleration. That is, compared to a high energy mode of operation, more ions may stray away from the ion beam and get intercepted by the electrodes of the column 108. In certain instances, the ion beam may generate secondary ions/electrons that may intercept the electrodes of the column 108. When sufficient ions/electrons intercept the electrodes of the column 108, latch-up may occur. That is, the divider current may be insufficient to maintain the voltage gap between two electrodes and can lead to voltage collapse. Latch-up may cause focus degradation and eventually lead to an unrecoverable situation due to the electrodes of the column 108 changing voltage from ion/electron current. Very similar instability may occur for the deceleration.

Generally, the lower the ion beam energy, the higher the current flowing through the resistor chain may be required. Therefore, much higher ballast current may be required for low energy acceleration and deceleration than for the high energy acceleration. This is practically impossible to accomplish by using just a linear single resistor chain. For example, when the beam has a low energy, the Ohms law dictates a low resistance to maintain a sufficient current ($I=V/R$). However, when the beam has a high energy, a high voltage may be necessary. Power generated may be high if both current and voltage are high ($P=IV=I^2R=V^2/R$). A lot of heat may be generated by the current. The resistors may get extremely hot and their resistance changes.

One possible solution to the above described problems has been to use switches to select a different resistor chain with lower resistance for low energy acceleration and deceleration. The switches may be activated electrically and may be referred to as electrical switches. The electrical switches may be activated by relays, for example. The switches may also be powered by pressurized fluid and may be referred to as hydraulic/pneumatic switches. The hydraulic/pneumatic switches may be activated by pressurized media in a conduit made of dielectrical material (e.g., polytetrafluoroethylene (PTFE) air lines). However, for low resistance resistors, the ballast current typically becomes very high and generates a lot of heat on the resistors, possibly leading to over-heating and thermal failure. To avoid this from happening, proper switching sequence depending on acceleration voltage may be chosen.

The second concern with the conventional resistive divider in wide range of voltage for ion implantation may be high electric field stress that each resistor may be required to be protected against. In a high energy mode, a high acceleration voltage (e.g., above 650 kV) may be graded over the resistor chain. Conductive materials of the resistors, such as lead or ferrule connections, may need shielding due to high electric field stress. Such shielding has previously been achieved by placing the resistor chain in a pressurized vessel that may be filled with a high dielectric strength material (e.g., SF6 gas). However, service of the resistor chain is not easy in such configuration as the pressurized vessel needs to be drained, which may be slow and labor intensive.

In view of the foregoing, it may be understood that there are significant problems and shortcomings associated with current technologies in controlling an accelerated or decelerated charged particle beam for ion implanters.

SUMMARY OF THE DISCLOSURE

Techniques for controlling a charged particle beam are disclosed. In one particular exemplary embodiment, the techniques may be realized as a charged particle acceleration/deceleration system. The charged particle acceleration/deceleration system may comprise an acceleration column. The acceleration column may comprise a plurality of electrodes having apertures through which a charged particle beam may pass. The charged particle acceleration/deceleration system may also comprise a plurality of resistors electrically coupled to the plurality of electrodes. The charged particle acceleration/deceleration system may further comprise a plurality of switches electrically coupled to the plurality of electrodes and the plurality of resistors, wherein each of the plurality of switches may be configured to be selectively switched respectively in a plurality of operation modes.

In accordance with other aspects of this particular exemplary embodiment, the charged particle acceleration/deceleration system may further comprise a first power supply to provide an acceleration voltage, a second power supply to provide a deceleration voltage, a first switch electrically coupled to the first power supply, and a second switch electrically coupled to the second power supply. The second switch may be configured to operate in a high voltage environment.

In accordance with further aspects of this particular exemplary embodiment, the plurality of resistors may comprise a serial chain of resistors. Each switch may be electrically connected in parallel with at least one of the plurality of resistors in the serial chain. At least one of the plurality of switches may be serially connected to at least one of the plurality of resistors in the chain. The at least one serially connected electrical switches and the at least one resistor may be connected in parallel to at least one other of the plurality of resistors.

In accordance with additional aspects of this particular exemplary embodiment, the charged particle acceleration/deceleration system may further comprise a plurality of actuators. Each switch may be connected to a respective one of the plurality of actuators respectively.

In accordance with still further aspects of this particular exemplary embodiment, at lease one switch may be activated by pressurized fluid, and the pressurized fluid may be selected from a group consisting of: pressurized air, pressurized gas, and pressurized liquid.

In accordance with still additional aspects of this particular exemplary embodiment, at least one switch may be activated by electrical signals and the electrical signals may be transmitted by a relay.

In another particular exemplary embodiment, the techniques may be realized as a charged particle acceleration/deceleration system. The charged particle acceleration/deceleration system may comprise an acceleration column. The acceleration column may comprise a plurality of electrodes having apertures through which a charged particle beam may pass. The charged particle acceleration/deceleration system may also comprise a plurality of resistor assemblies. Each resistor assembly may comprise at least one resistor. The at least one resistor may be electrically connected between two electrical contacts of a support structure. Each electrical contact may be electrically connected to a respective one of the plurality of electrodes. Each resistor assembly may further comprise a switch. The switch may be electrically connected between the two electrical contacts parallel to the at least one resistor.

In accordance with other aspects of this particular exemplary embodiment, the support structure may be a printed circuit board. Further, at least one of the plurality of resistor assemblies may further comprise at least one additional resistor serially electrically connected to the switch between the two electrical contacts.

In accordance with further aspects of this particular exemplary embodiment, each switch may be pneumatically controlled.

In accordance with additional aspects of this particular exemplary embodiment, each switch may be electrically controlled.

In accordance with still other aspects of this particular exemplary embodiment, the switches of the plurality of resistor assemblies may be grouped into at least two groups. The switches in each group of the at least two groups may be commonly selectively operated.

In accordance with still further aspects of this particular exemplary embodiment, each of the resistor assemblies may be potted in a high dielectric strength material. The high dielectric strength material may be selected from a group consisting of: heat conductive epoxy and silicone based compound.

In yet another particular exemplary embodiment, the techniques may be realized as an apparatus for making an electrical connection. The apparatus may comprise at least one resistor attached to a support structure. The at least one resistor may be electrically connected between two electrical contacts on the support structure. The apparatus may also comprise a switch electrically positioned between the two electrical contacts. The switch may comprise a housing having a non-conductive section constructed substantially of a non-conductive material. At least a portion of the non-conductive section may be positioned between the two electrical contacts on the support structure. The switch may further comprise a shuttle selectively displaceable within the housing. The shuttle may be biased in a first position proximate one electrical contact of the two electrical contacts in a first mode of operation and may be displaceable toward the other electrical contact of the electrical contacts to establish an electrical connection between the two electric contacts in a second mode of operation.

In accordance with other aspects of this particular exemplary embodiment, the apparatus may further comprise a layer of potting material. The layer of potting material may wrap around the support structure, the at least one resistor and the switch. Further, the potting material may be a dielectric and thermal conductive material. The dielectric and thermal conductive material may be selected from a group consisting of: thermal conductive epoxy and silicone based compound.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 3A depicts a schematic diagram of a resistor assembly in accordance with an embodiment of the present disclosure.

FIG. 3B depicts a schematic diagram of a resistor assembly in accordance with an embodiment of the present disclosure.

FIG. 4A depicts a schematic diagram of a resistor assembly on a support structure in accordance with an embodiment of the present disclosure.

FIG. 4B depicts a schematic diagram of a resistor assembly on a support structure in accordance with an embodiment of the present disclosure.

DETAILED DESCRIPTION OF EXEMPLARY EMBODIMENTS

Figure 1:
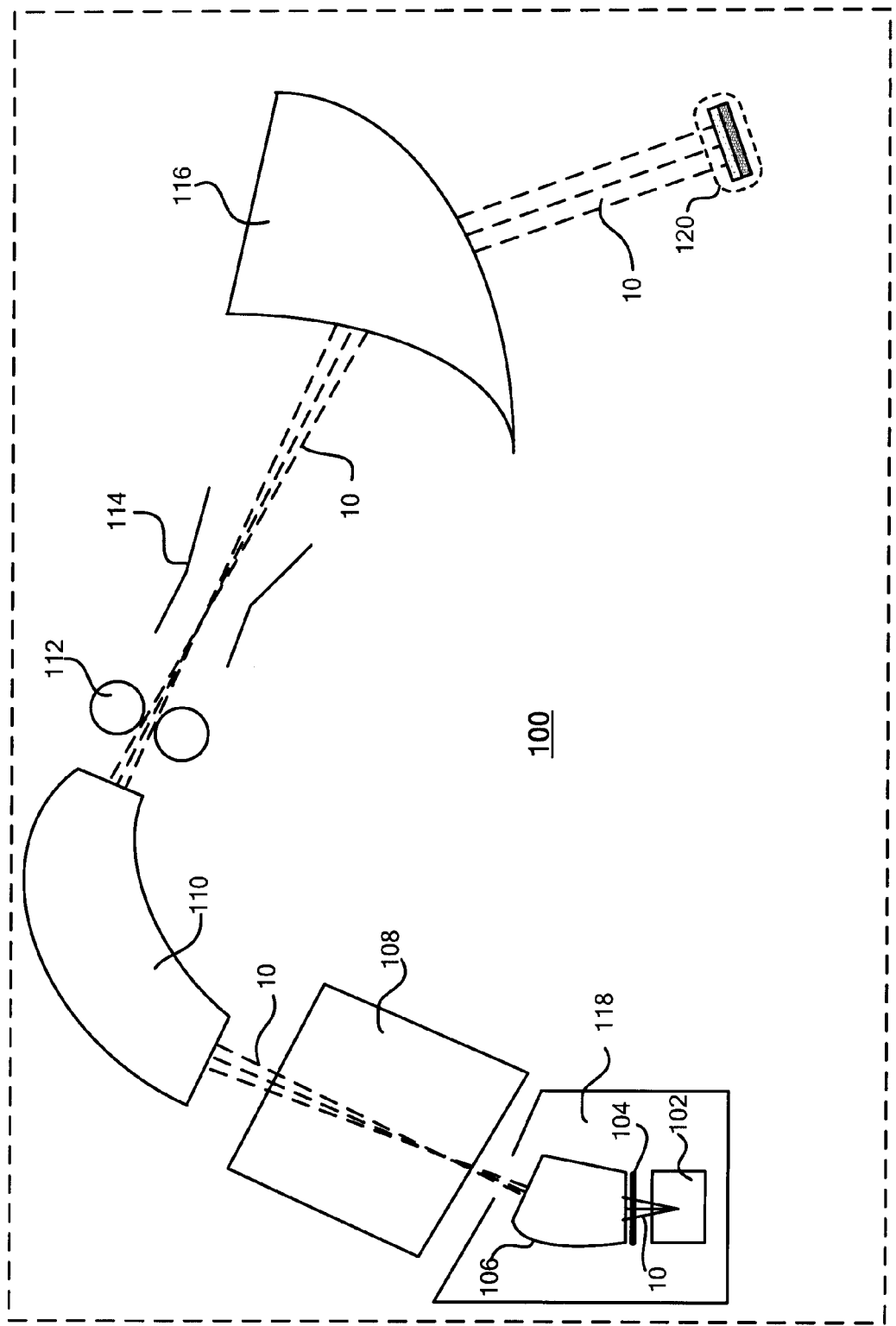
FIG. 1 depicts a conventional ion implanter system.
Figure 2:
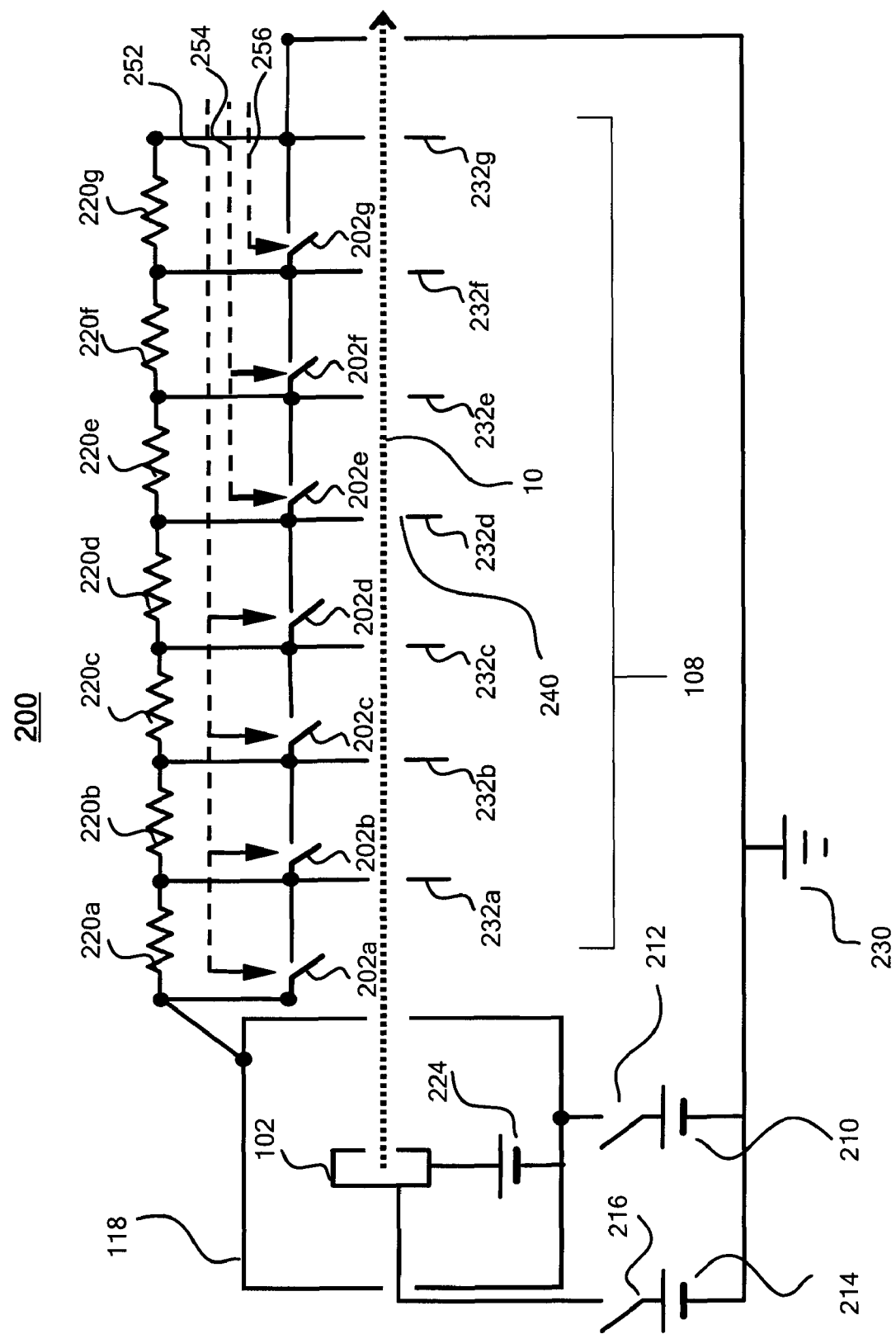
FIG. 2 depicts a schematic diagram of a charged particle acceleration/deceleration system in accordance with an embodiment of the present disclosure.

FIG. 2 depicts a schematic diagram of a charged particle acceleration/deceleration system 200 of an ion implanter in accordance with an embodiment of the present disclosure. It should be appreciated by one skilled in the art that only the ion beam 10, ion source 102, the terminal 118, and acceleration or deceleration column 108 are incorporated into FIG. 2. As a result, those elements in FIG. 2 should be understood in relation to corresponding elements in FIG. 1.

Referring to FIG. 2, in the charged particle acceleration/deceleration system 200, the ion beam 10 may be extracted from the ion source 102. The ion source 102 may be referenced to an extraction power supply 224. The extraction power supply 224 may provide a positive voltage for the ion source 102 relative to the terminal 118. The ion source 102 may be separated from a ground 230 by a deceleration switch 216 and a deceleration power supply 214. The ion source 102 may also be separated from the ground 230 via the extraction power supply 224, an acceleration switch 212 and an acceleration power supply 210. The terminal 118 may be separated from the ground 230 by the acceleration switch 212 and the acceleration power supply 210. It should be noted that an charged particle acceleration/deceleration system in accordance with the present disclosure may accelerate and/or decelerate an ion beam.

The extracted ion beam 10 may then pass through an aperture on the terminal 118 and enter the acceleration or deceleration column 108 shown in FIG. 2. The acceleration or deceleration column 108 may be schematically depicted in FIG. 2 by a plurality of electrodes 232. The plurality of electrodes 232 may be spaced-apart conductive plates having apertures 240. In the embodiment of FIG. 2, the plurality of electrodes 232 includes electrodes 232a, 232b, 232c, 232d, 232e, 232f and 232g. The ion beam 10 may be accelerated or decelerated to a specific energy level and then leave the acceleration or deceleration column 108.

A positive voltage supplied by the acceleration power supply 210 may be applied to the electrodes 232 by a chain of resistors 220 and a chain of hydraulic/pneumatic or electrical switches 202 to manage the beam optics depending on acceleration voltage. In the embodiment of FIG. 2, the chain of resistors 220 includes resistors 220a, 220b, 220c, 220d, 220e, 220f and 220g. Parallel to the resistors 220, the chain of switches 202 may include switches 202a, 202b, 202c, 202d, 202e, 202f and 202g. A resistor and its corresponding switch may be referred to as a grading resistor assembly. Thus, there are seven resistor assemblies shown in the charged particle acceleration/deceleration system 200 to divide acceleration voltage into seven equal potentials. It should be noted that the resistors 220 may not have the same resistance value in other embodiment in accordance with the present disclosure, and the voltage may not be divided equally. Moreover, as shown in FIG. 2, the chain of switches 202 may be grouped in 3 groups. The switches 202a, 202b, 202c and 202d may be connected to a control cable 252. The switches 202e and 202f may be connected to a control cable 254. The switch 202g may be connected to a control cable 256. Therefore, the seven resistor assemblies may be selectively controlled by the control cables 252, 254 and 256. The chain of resistor assemblies may be referred to as a voltage grading resistor assembly chain in the present disclosure. Also, each of the control cable may be referred to as an actuator in the present disclosure.

In one exemplary embodiment of the charged particle acceleration/deceleration system 200, each of the switches 202 may be activated by pressurized air, gas or liquid as will be described later. Therefore, each actuator may be pressurized air lines made of dielectrical material and may operate switches by pressurized air, gas or liquid (e.g., PTFE air lines).

In another exemplary embodiment of the charged particle acceleration/deceleration system 200, each of the switches 202 may be activated electrically. Therefore, each actuator may operate switch(es) by transmitting electrical signals (e.g., relays).

The charged particle acceleration/deceleration system 200 is designed to achieve a wide range of energy levels for the ion beam 10 (e.g., 1 kV to about 750 kV for single charged particles). The wide range of energy levels may be achieved by a plurality of operation modes of the charged particle acceleration/deceleration system 200. The plurality of operation modes may be provided by operating the deceleration switch 216, the acceleration switch 212, the switches 202 of the grading resistor assemblies, the extraction power supply 224, the deceleration power supply 214 and the acceleration power supply 210 in tandem, as described in detail below. Further, the selectively controlled seven resistor assemblies may help to selectively change resistance between electrodes 232 according to acceleration or deceleration energy, thereby, maintaining ballast current accordingly, also described in detail below.

For example, in a first exemplary operation mode, the charged particle acceleration/deceleration system 200 may operate to achieve medium to high energy levels (e.g., 80 kV to 625 kV). In this operation mode, the deceleration switch 216 may be left open and the acceleration switch 212 may be closed. The ion beam 10 may be extracted by a positive extraction voltage provided by the extraction power supply 224. The acceleration power supply 210 may provide a positive voltage between the terminal 118 and the ground 230. Thus, after gaining initial extraction energy, the ion beam 10 may be further accelerated by the electrodes 232. This exemplary mode of operation may be referred to as an acceleration mode in the present disclosure.

In the acceleration mode of operation, the acceleration power supply 210 may provide a high positive voltage such as, but not limited to, a high positive voltage in the order of 670 kV. This acceleration mode of operation may be referred to as a high beam energy acceleration mode of operation. In the high beam energy acceleration mode, the deceleration switch 216 may be designed to sustain a voltage gap of more than 670 kV (e.g., the extraction voltage and the acceleration voltage) between the ion source 102 and the ground 230 in this operation mode.

Also in the acceleration mode of operation, the desired energy level of the ion beam 10 may be on a low end of an energy level range, thereby allowing the positive voltage provided by the acceleration power supply 210 to be low. This acceleration mode of operation may be referred to as a low energy beam acceleration mode of operation. As previously noted, in certain circumstances, because ion beam rigidity is low, the electrodes 232 may intercept ions or secondary ions/electrons (e.g., beam strike). Therefore, higher ballast current may be required to maintain a low energy voltage potential gradient across the electrodes 232 in the acceleration mode of operation.

The switches 202 may be selectively closed to provide multiple modes of acceleration as noted previously. However, when one or more electrodes are grounded to the terminal, the ballast current for the grounded electrodes may be defined by a current capability of the acceleration power supply 210. The grounded electrodes that are close to the terminal may have very high ballast current (e.g., close to the current capability of the acceleration power supply 210). For these electrodes, current caused by beam strike is not an issue. Further, the remaining electrodes may have a higher voltage dropped across them. Thus, the ballast current for the remaining electrodes is also higher.

For example, in one exemplary operation mode, the resistors 220 and the switches 202 may provide a 7 gap acceleration mode. In the 7 gap acceleration mode, all switches 202 may be open, and thus the voltage provided by the acceleration power supply 210 is graded across the electrodes 232 via the chain of resistors 220. This mode of acceleration may be used when the positive voltage provided by the acceleration power supply 210 is high enough that the ion beam 10 has high beam rigidity and the ballast current is not a big concern. The ballast current may be low but may not be below 5-10% of the ion beam current. The resistance of each of the resistors 220 may be high (e.g., 100 MOhm, or 150 MOhm) giving relatively low ballast current, which may keep the power sufficiently low. It should be noted that a trade off may be made between ballast current (I=V/R) and power generated (P=IV). From a product safety perspective, the components may not get above 60 degree Celsius (60° C.).

In another example, the resistors 220 and the switches 202 may provide a 3 gap acceleration mode. In the 3 gap acceleration mode, the actuator 252 may close the switches 202*a*, 202*b*, 202*c*, and 202*d*. The remaining switches 202*e*, 202*f* and 202*g* may be left open. Thus, the electrodes 232*a*, 232*b*, 232*c*, and 232*d* are electrically shorted to the terminal 118. Further, the positive voltage provided by the acceleration power supply 210 is spread across the electrodes 232*e*, 232*f*, and 232*g*. Higher ballast current may be achieved by applying the low positive voltage provided by the acceleration power supply 210 across fewer resistors. Thus, a relatively high ballast current running over resistors 220*e*, 220*f*, and 220*g* may be achieved. This mode of operation may be used when the positive voltage provided by the acceleration power supply 210 is low and the ion beam 10 has low beam rigidity.

In yet another example, the resistors 220 and the switches 202 may provide a 1 gap acceleration mode. In the 1 gap acceleration mode, the actuator 252 may close the switches 202*a*, 202*b*, 202*c*, and 202*d*, and the actuator 254 may close the switches 202*e* and 202*f*. The remaining switch 202*g* may be left open. Thus, the electrodes 232*a*, 232*b*, 232*c*, 232*d*, 232*e*, and 232*f* are electrically shorted to the terminal 118. Further, the positive voltage provided by the acceleration power supply 210 is applied between the electrodes 232*f* and 232*g*. In this mode of operation, the acceleration power supply 210 may provide a large current that the current caused by the interception of ions/electrons on the electrodes 232*f* and 232*g* may not affect the voltage gap.

In a second exemplary operation mode, the charged particle acceleration/deceleration system 200 may operate to achieve low to medium energy levels (e.g., 40 kV to 80 kV). In this operation mode, the deceleration switch 216 may be left open and the acceleration switch 212 may be closed. The ion beam 10 may be extracted by a positive extraction voltage provided by the extraction power supply 224. The acceleration power supply 210 may be programmed to provide 0 V or turned off. Thus, after gaining initial extraction energy, the ion beam 10 may drift through the electrodes 232 without any further acceleration or deceleration (e.g., no change to the energy of the ion beam 10). This exemplary mode of operation may be referred to as a drift mode in the present disclosure.

In this drift mode of operation, because the acceleration power supply 210 may be programmed to provide 0 V or turned off, the energy of the ion beam may depend only on the extraction voltage provided by the extraction power supply 224 between the ion source 102 and the ground 230. Further, the actuators 252, 254 and 256 may close all of the switches 202. Such that, all of the electrodes 232 may be grounded and no charge may build up on the electrodes because of ions or secondary ions/electrons interception. There may be current from the ion beam striking the electrodes, but the current flows directly to ground 230 not through the resistors 220. There is no significant limit to the ballast current in the drift mode of operation.

In a third exemplary operation mode, the charged particle acceleration/deceleration system 200 may operate to achieve ion energy lower than the extraction energy (e.g., 1 kV to 40 kV). In this operation mode, the deceleration switch 216 may be closed and the acceleration switch 212 may be left open. The ion beam 10 may be extracted by a positive extraction voltage provided by the extraction power supply 224. The deceleration power supply 214 may provide a positive voltage lower than the positive voltage provided by the extraction power supply 224. Thus, the terminal 118 may be placed at a negative voltage relative to the ground 230. Therefore, after gaining initial extraction energy, the ion beam 10 may be decelerated by the electrodes 232. The final energy of the ion beam 10 may be determined by the setting of the deceleration power supply 214. For example, the extraction power supply 224 may provide a positive voltage of 60 kV, the deceleration power supply 214 may provide a positive voltage of 40 kV. Because the deceleration power supply 214 provides a voltage relative to the ground 230, the ion source 102 may be at 40 kV relative to the ground 230. The positive voltage of 60 kV provided by the extraction power supply 224 may be between the ion source 102 and the terminal 118. Thus, the terminal 118 may have a negative voltage of 20 kV relative to the ground 230. This negative voltage of 20 kV may be applied to the electrodes 232 to generate an electrical field in a direction opposite to the direction of travel of ions in the ion beam 10. Therefore, the ion beam 10 may be decelerated by the electrodes 232. This exemplary mode of operation may be referred to as a deceleration mode in the present disclosure.

In the deceleration mode of operation, the desired energy level may be low (e.g., from 2 kV to 40 kV), thereby allowing the voltage applied between the terminal 118 and the ground 230 to be low (e.g., 20 kV in the previous example). As previously noted, in certain circumstances, because beam rigidity is low, the electrodes 232 may intercept ions or secondary ions/electrons. Thus, higher ballast current may be required to maintain the voltage potential gradient across the electrodes 232 in the deceleration mode of operation. The switches 202 may be selectively closed to further provide multiple modes of deceleration. Therefore, the voltage between the terminal 118 and the ground 230 may be applied over a subset of the resistors 220 (e.g., a one-gap deceleration may be used). High ballast current may be achieved.

In the charged particle acceleration/deceleration system 200, 7 electrodes and 7 resistor assemblies are shown in FIG. 2. In another exemplary embodiment of a charged particle acceleration/deceleration system in accordance with the present disclosure, a different number of electrodes and a different number of resistor assemblies may be used. The number of resistor assemblies is not required to match the number of electrodes (e.g., the neighboring electrodes may be connected to the same voltage if beam optics requires). The number of the resistor assemblies may depend on the maximum voltage used and other factors, such as, but not limited to, efficient beam optics (e.g., high beam transmission through the acceleration and deceleration column 108), electrical stress per grading resistor assembly, and availability of high power and high voltage resistors.

Also, in the charged particle acceleration/deceleration system 200, each resistor assembly is shown to comprise one resistor. In another exemplary embodiment of a charged particle acceleration/deceleration system in accordance with the present disclosure, each resistor assembly may comprise a number of resistors between two electrical contacts. For example, an exemplary embodiment of such a resistor assembly is shown in FIG. 3A and 3B, and described in detail below.

Moreover, in the charged particle acceleration/deceleration system 200, each of the resistors 220 may have an equal resistance value. It should be noted that in another exemplary embodiment of a charged particle acceleration/deceleration system in accordance with the present disclosure, each of resistors 220 may have a desired resistance value. The desired resistance value for each of the resistors 220 is not required to be the same.

Still further, in the charged particle acceleration/deceleration system 200, 7 resistor assemblies are shown to be controlled by 3 actuators. In another exemplary embodiment of a charged particle acceleration/deceleration system in accordance with the present disclosure, each switch of a resistor assembly may be controlled by an actuator respectively. In yet another exemplary embodiment, the switches may be controlled in a different number of groups respectively, and each group may have a different number of switches.

FIGS. 3A and 3B depict an exemplary resistor assembly 300 in two operation modes in accordance with an embodiment of the present disclosure. The resistor assembly 300 may be used in an exemplary embodiment of a charged particle acceleration/deceleration system in accordance with the present disclosure. For example, the resistor assembly 300 may be used in the charged particle acceleration/deceleration system 200. The resistor assembly 300 may be placed between the terminal 118 and the first electrode 232a, or may be placed between any two adjacent electrodes in FIG. 2. That is, electrical contacts 322 and 332 may be connected to the terminal 118 and the first electrode 232a, or may be connected to any two electrodes. A voltage gap may thereby be maintained for an acceleration or deceleration mode of operation of the charged particle acceleration/deceleration system 200.

Referring to FIG. 3A, the exemplary resistor assembly 300 is shown in a first mode of operation in accordance with an embodiment of the present disclosure. As shown in FIG. 3A, in the first mode of operation, a switch 310 is disconnected. That is, a shuttle 312 inside a housing 314 of the switch 310 is connected to a first electrical contact 318 but separated from a second electrical contact 316 by an insulating medium in the housing 314. The insulating medium may be maintained in the housing 314 by two caps 320a and 320b at two distal ends of the housing 314. The insulating medium may be air, or a high dielectric strength gas (e.g., SF6) or liquid (e.g., liquid silicone). At least a portion of the housing 314 may be made from a non-conductive material such that the two electrical contacts 316 and 318 are not connected when the shuttle 312 is not in contact with the electrical contact 316.

The electrical contact 316 may be connected to the electrical contact 322 via two resistors 304a and 304b. The resistors 304a and 304b may connected in series as shown. The electrical contact 318 may be connected to the electrical contact 332 via three resistors 304c, 304d, and 304e. The resistors 304c, 304d, and 304e may connected in series as shown.

In the first mode of operation that the switch 310 is disconnected, there is no electrical current flowing through the resistors 304 and an electrical voltage difference between the electrical contacts 322 and 332 is sustained by the open switch 310. Thus, when the charged particle acceleration/deceleration system 200 is operating in the acceleration mode for a high energy level, there may be a high voltage sustained by the switch 310 (e.g., 112 kV). Therefore, the switch 310 may be an electrical or hydraulic/pneumatic switch suitable for high voltage environments, such as, but not limited to, a switch described in U.S. Pat. No. 6,717,079 issued to Heller, which is incorporated herein by reference in its entirety.

Furthermore, in the first mode of operation that the switch 310 is disconnected, the electrical voltage difference between the electrical contacts 322 and 332 is distributed across a chain of resistors 302. The resistors 302a, 302b, 302c, 302d, and 302e may be used at high and medium energy range and of resistance value of about 75 Mohm to 200 Mohm per resistor assembly, for example.

In another exemplary embodiment of a resistor assembly in accordance with embodiments of the present disclosure, a parallel/serial combination of resistors 304 may be used depending on the ballast current requirement.

In yet another exemplary embodiment of a resistor assembly in accordance with embodiments of the present disclosure, more than two resistors may be paralleled, and groups of paralleled resistors may be chained between the electrical contacts 322 and 332.

In still another exemplary embodiment of a resistor assembly in accordance with embodiments of the present disclosure, a single resistor may be used between the electrical contacts 322 and 332. For example, the single resistor may be a metal oxide high voltage resistor of resistance value about 10 to 100 Mohm, 30 to 100 kV voltage rating, 15 to 100 W power rating.

Referring to FIG. 3B, the exemplary resistor assembly 300 is shown in a second mode of operation in accordance with an embodiment of the present disclosure. As shown in FIG. 3B, in the second mode of operation, the switch 310 may connect the electrical contacts 316 and 318. That is, the shuttle 312 may be extended across the insulating medium to connect to the electrical contact 316. The shuttle 312 may be pressurized to move cross the insulating medium by pressurized gas, as described in the Heller patent.

As previously noted, when the charged particle acceleration/deceleration system 200 operates in a low energy acceleration or deceleration mode of operation, a low voltage gap may need to be maintained across the terminal 118 and the electrodes 232. In this circumstance, the resistor assembly 300 may be used to maintain a low voltage gap between the electrical contacts 322 and 332 with a sufficient ballast current. The sufficient ballast current may be achieved by keeping resistors 304 in a low resistance, such as, but not limited to, 20 Mohm to 40 Mohm per resistor assembly, for example. Because the resistors 304 are parallel to the resistors 302, a high ballast current may be maintained for a low voltage gap (e.g., 10 kV) between the electrical contacts 322 and 332.

In another exemplary embodiment of a resistor assembly in accordance with embodiments of the present disclosure, resistors 304 may be eliminated. That is, electrical contact 316 may connect directly to the electrical contact 322 and electrical contact 318 may connect directly to the electrical contact 332. Therefore, in the second mode of operation, the resistor assembly 300 may short circuit the electrical contacts 322 and 332.

In yet another exemplary embodiment of a resistor assembly in accordance with embodiments of the present disclosure, more or less resistors may be used between the electrical contacts 316 and 322, and between electrical contacts 318 and 332.

FIGS. 4A and 4B depict a schematic diagram of a resistor assembly 400 on a support structure and the resistor assembly 400 on the support structure in a potting material in accordance with an embodiment of the present disclosure, respectively. An exemplary embodiment of a resistor assembly in accordance with embodiments of the present disclosure may be implemented using a printed circuit board as the support structure. That is, the resistors and the switch of a resistor assembly in accordance with an embodiment of the present disclosure described previously may be placed on a printed circuit board. It should be appreciated that more than one resistor assembly may be placed on a support structure in an exemplary embodiment in accordance with the present disclosure.

As shown in FIG. 4A, an exemplary embodiment of the resistor assembly 400 in accordance with embodiments of the present disclosure may be realized by placing resistors 402, 404, and 406 and a switch 410 on a printed circuit board 420.

The resistors 402 and 404 may be resistors with a large resistance (e.g., 10 to 200 Mohm) and serially connected between two electrical contacts 412 and 416 of the printed circuit board 420. The switch 410 and the resistor 406 may also be serially connected between two electrical contacts 412 and 416. That is, the switch 410 and the resistor 406 may be parallel to the resistors 402 and 404. The switch 410 may be a switch as described in the Heller patent. The resistor 406 may be a resistor with a small resistance connected in series with the switch 410 (e.g., 5 to 40 Mohm).

When the switch 410 is open, the resistors 402 and 404 may be used to sustain a high voltage between the two electrical contacts 412 and 416. Because of the large resistance of the two resistors 402 and 404, a small ballast current may be maintained. However, a strong electrical field may be sustained by the two resistors 402 and 404, and conductive material of the resistors 402 and 404 may need shielding due to the high electric field stress. As described previously, a traditional way to shield the resistors 402 and 404 may be to put the resistors 402 and 404 in a pressure vessel and fill the vessel with a high dielectric strength gas (e.g., SF6) or liquid (e.g., liquid silicone). In an exemplary embodiment of the present disclosure, the resistor assembly 400 may be potted in a high dielectric strength material as shown in FIG. 4B and described in detail below.

When the switch 410 is closed, the resistors 402 and 404 may be parallel to the resistor 406 and the switch 410 between the two electrical contacts 412 and 416 as described previously. Because the low resistance of the resistor 406, a low voltage difference between the two electrical contacts 412 and 416 may cause a rather large ballast current. Heat dissipation may be a concern in this situation. A resistor assembly potted in a high dielectric strength material may also help heat dissipation.

Referring to FIG. 4B, the resistor assembly 400 is shown potted in a high dielectric strength material 408. As described previously, draining a pressure tank filled with an SF6 gas may not be an easy task and may be slow. In an exemplary embodiment in accordance with embodiments of the present disclosure, the resistor assembly 400 may be potted in the high dielectric strength material 408. For example, the resistor assembly 400 may be potted in a high dielectric strength plastic material 408 as shown in FIG. 4B. The high dielectric strength plastic material 408 may be highly heat conductive, thereby improving heat dissipation as compared to dielectric gas or dielectric liquid. In the exemplary embodiment shown in FIG. 4B, the high dielectric strength plastic material 408 may be heat conductive epoxy. It should be understood that other suitable dielectric materials may be used to pot the resistor assembly 400 in accordance with exemplary embodiments of the present disclosure.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A charged particle acceleration/deceleration system comprising:
   an acceleration column, the acceleration column comprising a plurality of electrodes having apertures through which a charged particle beam may pass;
   a plurality of resistors electrically coupled to the plurality of electrodes;
   a plurality of switches electrically coupled to the plurality of electrodes and the plurality of resistors, each of the plurality of switches configured to be selectively switched respectively in a plurality of acceleration operation modes; and
   a plurality of actuators comprising at least a first actuator configured to control a first subset of said plurality of switches and a second actuator configured to control a second subset of said plurality of switches to close said first subset of switches and open said second subset of switches during a first acceleration operation mode.

2. The charged particle acceleration/deceleration system of claim 1, further comprising:
   a first power supply to provide an acceleration voltage;
   a second power supply to provide a deceleration voltage;
   a first switch electrically coupled to the first power supply; and
   a second switch electrically coupled to the second power supply.

3. The charged particle acceleration/deceleration system of claim 2, wherein the second switch is configured to operate in a high voltage environment.

4. The charged particle acceleration/deceleration system of claim 1, wherein the plurality of resistors comprises a serial chain of resistors.

5. The charged particle acceleration/deceleration system of claim 4, wherein each switch is electrically connected in parallel with at least one of the plurality of resistors in the serial chain.

6. The charged particle acceleration/deceleration system of claim 1, wherein at least one switch is activated by pressurized fluid, and the pressurized fluid is selected from a group consisting of: pressurized air, pressurized gas, and pressurized liquid.

7. The charged particle acceleration/deceleration system of claim 1, wherein at least one switch is activated by electrical signals and the electrical signals are transmitted by a relay.

8. The charged particle acceleration/deceleration system of claim 5, wherein at least one of the plurality of switches is serially connected to at least one of the plurality of resistors in the chain, the at least one serially connected electrical switches and the at least one resistor being connected in parallel to at least one other of the plurality of resistors.

9. A charged particle acceleration/deceleration system comprising:
   an acceleration column, the acceleration column comprising a plurality of electrodes having apertures through which a charged particle beam may pass; and
   a plurality of resistor assemblies, each resistor assembly supported by a separate printed circuit board, and each resistor assembly comprising:
   at least one resistor, the at least one resistor being electrically connected between two electrical contacts of the printed circuit board, each electrical contact being electrically connected to a respective one of the plurality of electrodes; and
   a switch, the switch being electrically connected between the two electrical contacts parallel to the at least one resistor; and
   wherein the switches in each group of the at least two groups are controlled to close each switch of a first group and open each switch of a second group during a first acceleration operation mode.

10. The charged particle acceleration/deceleration system of claim 9 wherein at least one of the plurality of resistor assemblies further comprises at least one additional resistor serially electrically connected to the switch between the two electrical contacts.

11. The charged particle acceleration/deceleration system of claim 9, wherein each switch is pneumatically controlled.

12. The charged particle acceleration/deceleration system of claim 9, wherein each switch is electrically controlled.

13. The charged particle acceleration/deceleration system of claim 9, wherein the switches of the plurality of resistor assemblies are grouped into at least two groups.

14. The charged particle acceleration/deceleration system of claim 9, wherein each of the resistor assemblies is potted in a high dielectric strength material.

15. The charged particle acceleration/deceleration system of claim 14, wherein the high dielectric strength material is selected from a group consisting of: heat conductive epoxy and silicone based compound.

16. The charged particle acceleration/deceleration system of claim 9, wherein each switch comprises:
   a housing having a non-conductive section constructed substantially of a non-conductive material, at least a portion of the non-conductive section being positioned between the two electrical contacts on the printed circuit board; and
   a shuttle selectively displaceable within the housing, the shuttle being biased in a first position proximate one electrical contact of the two electrical contacts in a first mode of operation and being displaceable toward the other electrical contact of the electrical contacts to establish an electrical connection between the two electric contacts in a second mode of operation.

17. The charged particle acceleration/deceleration system of claim 16, further comprising a layer of potting material, wherein the layer of potting material wraps around the printed circuit board, the at least one resistor and the switch.

18. The charged particle acceleration/deceleration system of claim 17, wherein the potting material is a dielectric and thermal conductive material.

19. The charged particle acceleration/deceleration system of claim 18, wherein the dielectric and thermal conductive material is selected from a group consisting of: thermal conductive epoxy and silicone based compound.

* * * * *